United States Patent [19]

Nakamoto et al.

[11] Patent Number: 5,040,994
[45] Date of Patent: Aug. 20, 1991

[54] CONNECTOR STRUCTURE FOR HYBRID INTEGRATED CIRCUIT

[75] Inventors: Osamu Nakamoto, Ohta; Takahito Yanagita, Isesaki; Tomoji Izumi, Hatsukaichi; Nagahisa Fujita, Hioshima; Yuichi Itoh, Hiroshima, all of Japan

[73] Assignees: Sanyo Electric Co., Ltd., Osaka; Mazda Motor Corporation, Hiroshima, both of Japan

[21] Appl. No.: 454,958

[22] Filed: Dec. 22, 1989

[30] Foreign Application Priority Data

Dec. 23, 1988 [JP] Japan ............... 63-323741

[51] Int. Cl.$^5$ ............... H05K 5/00
[52] U.S. Cl. ............... 439/76; 361/395; 361/413
[58] Field of Search ............... 439/76, 79, 80; 361/395–399, 412, 415, 413; 29/830

[56] References Cited

U.S. PATENT DOCUMENTS

| 4,723,196 | 2/1988 | Hoffmeister et al. ............... 439/76 |
| 4,808,115 | 2/1989 | Norton et al. ............... 439/248 |
| 4,858,071 | 8/1989 | Manabe et al. ............... 361/395 |

FOREIGN PATENT DOCUMENTS

| 0366141 | 5/1990 | European Pat. Off. . |
| 8430486.2 | 1/1984 | Fed. Rep. of Germany . |
| 3228398 | 2/1984 | Fed. Rep. of Germany . |
| 3345701 | 6/1985 | Fed. Rep. of Germany . |
| 3437988 | 4/1986 | Fed. Rep. of Germany . |
| 3728456 | 3/1989 | Fed. Rep. of Germany . |
| 46-132234 | 4/1971 | Japan . |
| 63-16449 | 2/1988 | Japan . |
| 63-29947 | 2/1988 | Japan . |
| 63-131146 | 8/1988 | Japan . |

OTHER PUBLICATIONS

English Abstract of Japanese Patent Publication No. 59-141258–one page.
English Abstract of Japanese Patent Publication No. 61-166149–one page.

*Primary Examiner*—Neil Abrams

[57] ABSTRACT

In a connector structure for a hybrid integrated circuit, two hybrid integrated circuit boards each include a conductive layer having a predetermined pattern formed thereon and a plurality of circuit elements attached onto the conductive layer. The two integrated boards are separated from each other so that the conductive layers of the circuit boards oppose each other. The connector structure is provided with a pair of connecting pin support members which are fixed to the two hybrid integrated circuit boards, and on which a plurality of connecting pins connected to the conductive layers are attached. A connector housing has a fitting hole in which the connecting pin support members are fitted while overlapping each other.

16 Claims, 6 Drawing Sheets

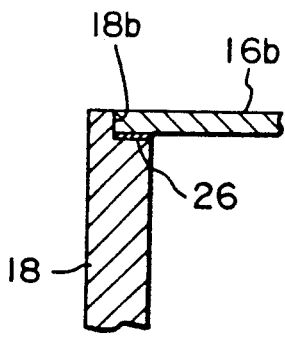
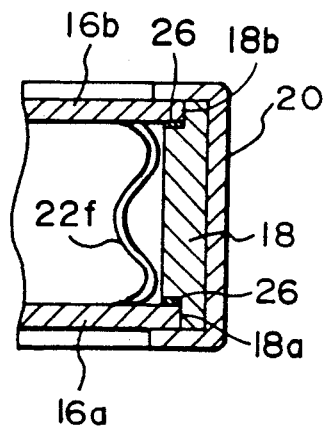
Fig. 3A                Fig. 3B
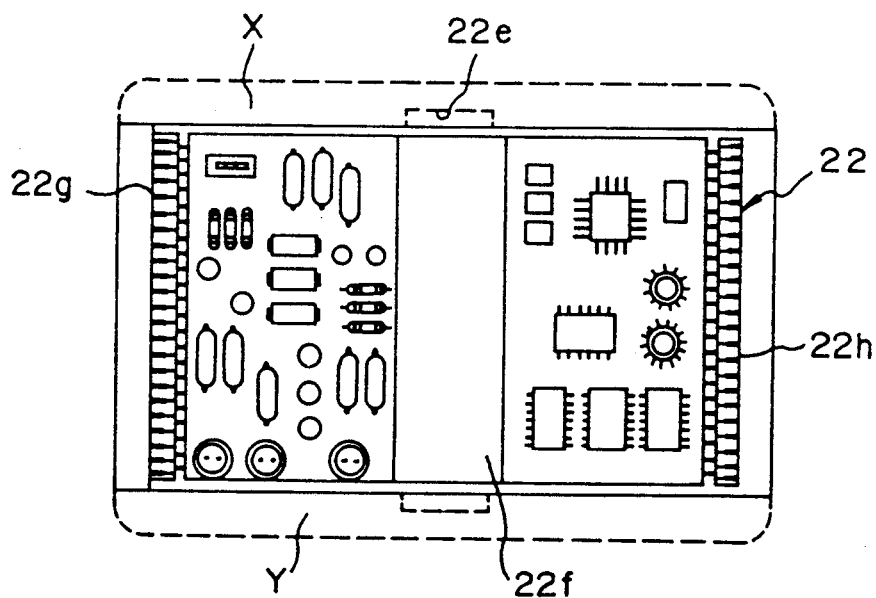
Fig. 4A
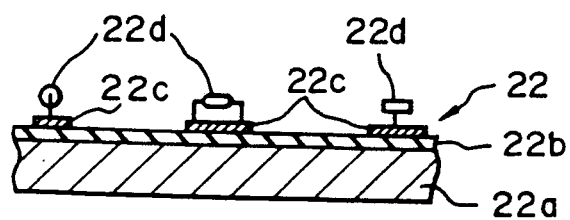
Fig. 4B

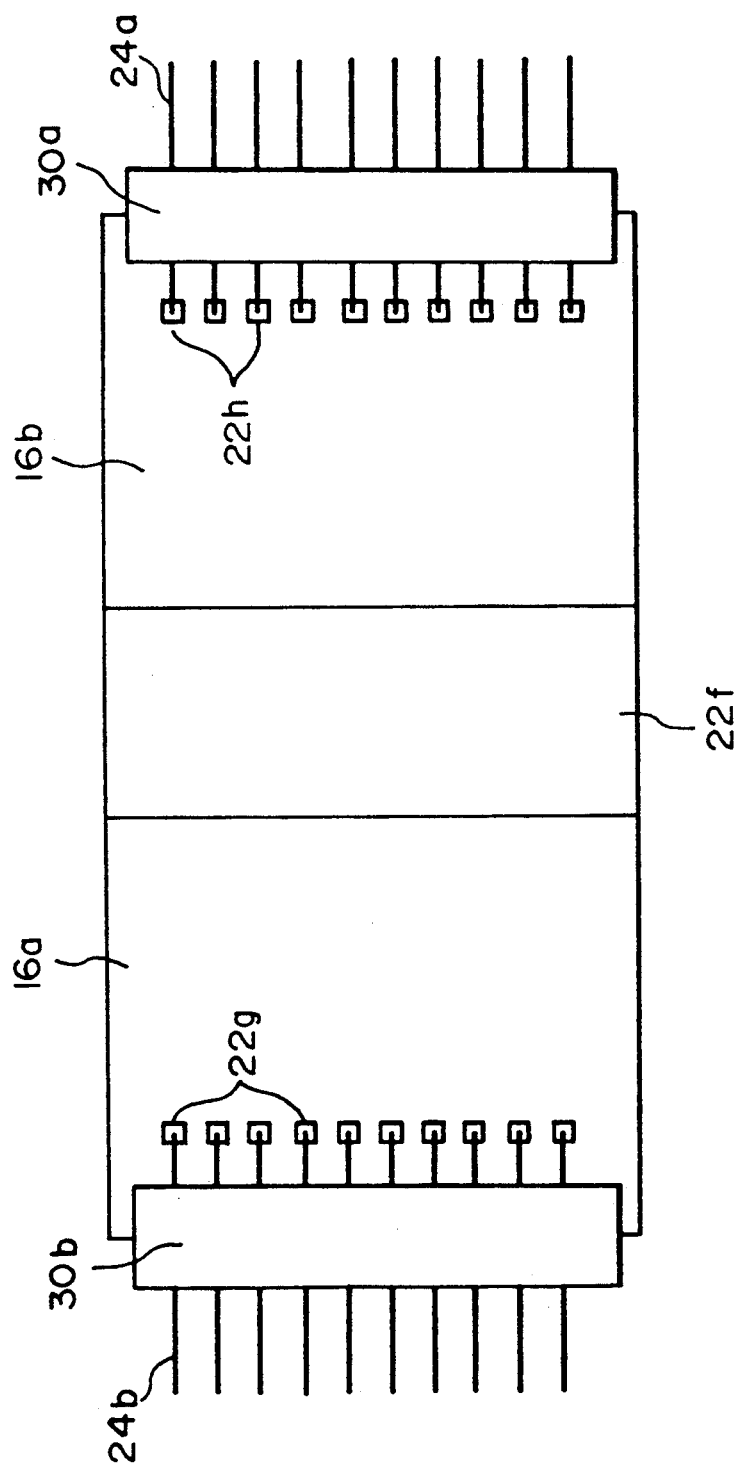

4
CONNECTOR STRUCTURE FOR HYBRID INTEGRATED CIRCUIT

BACKGROUND OF THE INVENTION

The present invention relates to a connector structure for a hybrid integrated circuit, which has two hybrid integrated circuit boards on each of which a conductive layer of a predetermined pattern is formed, and a plurality of circuit elements are attached onto the conductive layer.

Conventionally, a technique disclosed in Japanese Patent Publication No. 46-13234 is known as an integrated circuit having a pair of metal substrates, wherein conductive layers are adhered to each metal substrate through an insulating layer, a circuit element is fixed to each conductive layer, and the conductive layers are connected through a connecting substrate, and are separated from each other to face each other. A method of manufacturing the integrated circuit disclosed in this prior art comprises the step of anode-oxidizing at least one major surface of an aluminum substrate to form a thin aluminum oxide layer on the substrate surface, the step of selectively bonding and forming a resistive material and a high-conductivity material on the thin aluminum oxide film to form a plurality of circuit elements, the step of fixing transistor pellets on lead portions formed by selectively bonding the high-conductivity material, and the step of sealing at least all the circuit elements.

In the integrated circuit formed in this manner, heat radiated from the resistors or transistors is quickly and effectively dissipated to allow formation of an integrated circuit of an output circuit or the like.

The integrated circuit formed in this manner may be employed in a vehicle in view of its compact structure and low cost. However, when the integrated circuit is actually used in a vehicle, it must be reliably connected to other control portions of the vehicle while keeping its merits of the compact, low-cost structure. If an existing connecting device is used, since it is relatively large in size and is not inexpensive, the merit of the compact, low-cost structure of the integrated circuit cannot be satisfactorily obtained.

Even if the connecting device is made compact, if its assembly is not easy, the integrated circuit may not be assembled in practice. Thus, the connecting device must be made compact taking its assembly into consideration.

SUMMARY OF THE INVENTION

The present invention has been made in consideration of the above situation, and has as its principal object to provide a connector structure for a hybrid integrated circuit, which can achieve a compact, low-cost structure, and allows easy assembly.

It is another object of the present invention to provide a connector structure for a hybrid integrated circuit which can achieve a compact, low-cost structure, allows easy assembly, and can be firmly fixed to an integrated circuit.

In order to achieve the above objects, according to the present invention, there is provided a connector structure for a hybrid integrated circuit, in which two hybrid integrated circuit boards on each of which a conductive layer having a predetermined pattern is formed and a plurality of circuit elements are attached onto the conductive layer are separated from each other so that the conductive layers of the circuit boards oppose each other, which connector structure comprising a pair of connecting pin support members which are fixed to the two hybrid integrated circuit boards, and on which a plurality of connecting pins connected to the conductive layers are attached; and a connector housing having a fitting hole in which the connecting pin support members are fitted while overlapping each other.

In the connector structure for the hybrid integrated circuit according to the present invention, the conductive layers are connected to each other through a connecting substrate.

In the connector structure for the hybrid integrated circuit according to the present invention, the connecting pin support members are fixed to terminal end sides of the hybrid integrated circuit boards, and projections formed when the connecting pin support members are integrated are fitted in the fitting hole of the connector housing.

In the connector structure for the hybrid integrated circuit according to the present invention, the hybrid integrated circuit boards are separated by a predetermined distance by case members.

In the connector structure for the hybrid integrated circuit according to the present invention, each hybrid circuit board comprises a metal substrate subjected to an insulating treatment.

In the connector structure for the hybrid integrated circuit according to the present invention, the connector housing is integrated with the hybrid integrated circuit by a molding agent injected into the hybrid integrated circuit.

In the connector structure for the hybrid integrated circuit according to the present invention, the pair of connecting pin support members define an injection hole for injecting the molding agent when the pair of connecting pin support members are integrated to each other.

In the connector structure for a hybrid integrated circuit with the above arrangement, the connecting pin support members can be fixed to the corresponding circuit boards in an open state of the metal circuit boards, and a plurality of connecting pins can be connected to the corresponding conductive layers. Thus, the connecting operation can be easily and reliably performed since the metal circuit boards are in an open state, resulting in easy assembly.

When the metal circuit boards are assembled to face each other, both the connecting pin support members are coupled and are fitted together in a fitting hole formed in the connector housing, thus constituting one connector structure. At the same time, an integrated circuit integrally connected with this connector can be completed.

After the connector structure is constituted in this manner, the connector housing is fixed to the integrated circuit by a molding agent injected through the injection hole, thus integrating the housing and the integrated circuit.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 3A is a partial sectional view taken along a line A—A in FIG. 1;

FIG. 3B is a partial sectional view taken along a line B—B in FIG. 1;

FIG. 4A is a plan view showing an arrangement of a common circuit board;

FIG. 4B is a partial sectional view showing the arrangement of the common circuit board;

FIG. 8 is a top view showing a state before circuit boards to which connecting pin support members are fixed are assembled.

DETAILED DESCRIPTION OF THE PREFERRED EMBODIMENTS

An embodiment of a connector structure for a hybrid integrated circuit according to the present invention will be described in detail below with reference to FIGS. 1 to 8.

Figure 1:
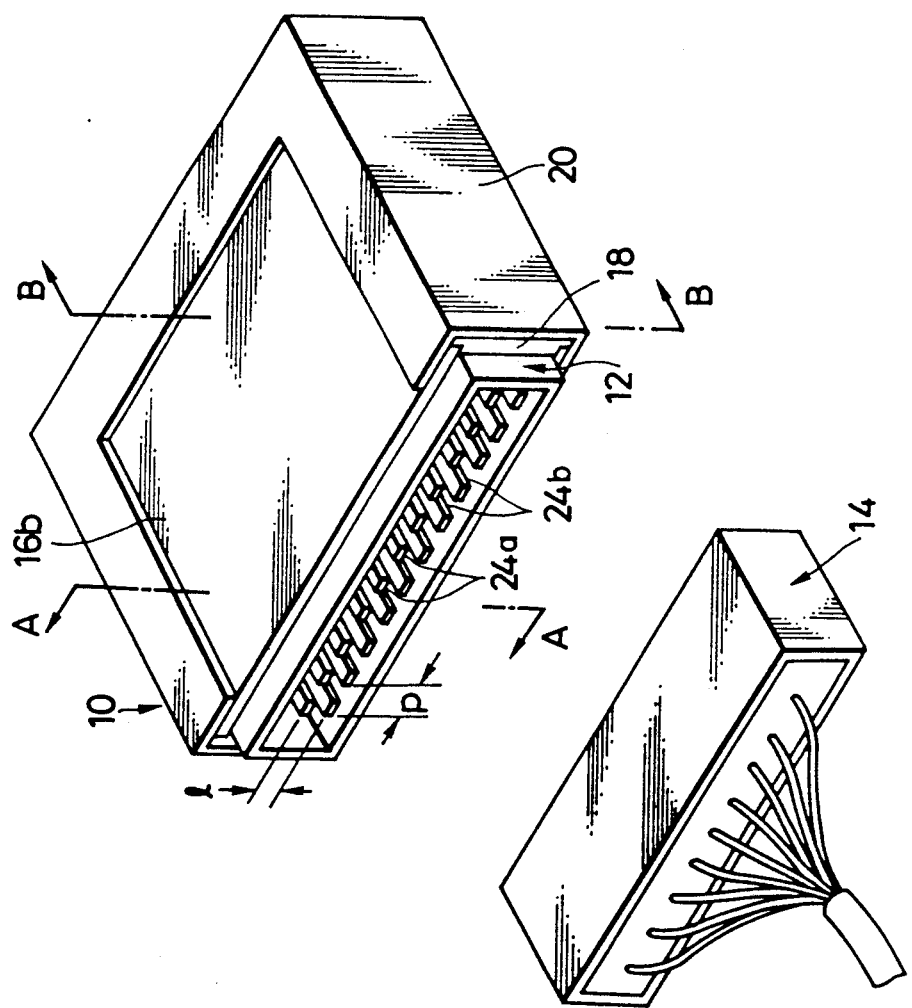
FIG. 1 is a perspective view showing an embodiment of a connector structure for a hybrid integrated circuit according to the present invention, together with an integrated circuit to which the connector structure is applied.

FIG. 1 shows an integrated circuit 10 to which a connecting device having the connector structure of this embodiment is connected. The integrated circuit 10 is arranged as a control unit, i.e., as a vehicle functional component. More specifically, the integrated circuit 10 is arranged as an integrated circuit independently having a function of an engine control unit.

As shown in FIG. 1, the integrated circuit 10 is formed as a box-like case, whose interior is closed. A male connector 12 as a connecting device is integrally mounted on one end of the integrated circuit 10. The male connector 12 is connected to a conventional female connector 14, as will be described in detail below.

Figure 2:
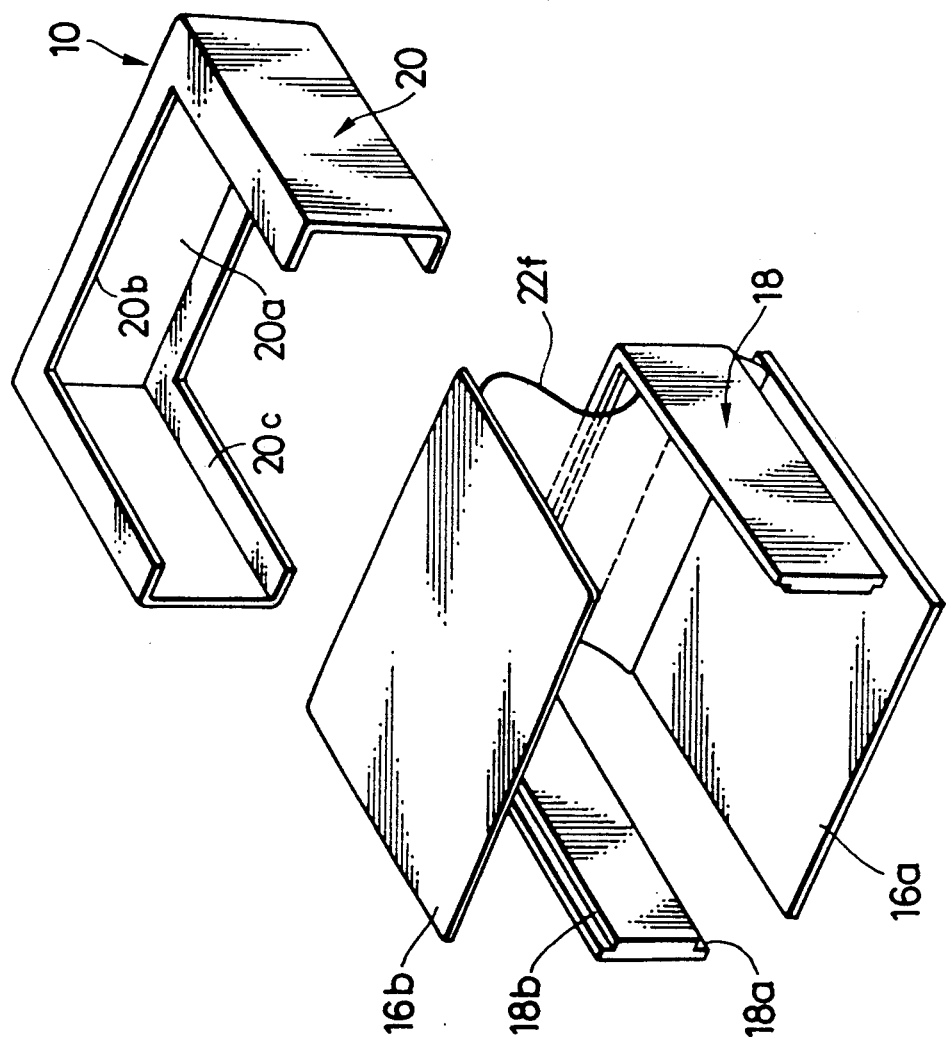
FIG. 2 is an exploded perspective view showing an arrangement of the integrated circuit shown in FIG. 1.

As shown in FIGS. 2 to 3B, the integrated circuit 10 comprises a pair of first and second circuit boards 16a and 16b which are vertically separated from each other, a side plate 18 for separating the first and second circuit boards 16a and 16b at a predetermined distance and closing the side surfaces, and a frame 20 for integrally fixing the first and second circuit boards 16a and 16b and the side plate 18.

Circuit elements such as IC chips, resistors, capacitors, and the like necessary for providing the function of the engine control unit are mounted on the first and second circuit boards 16a and 16b. As shown in FIG. 4A, the first and second circuit boards 16a and 16b are formed by splitting a single common circuit board 22. More specifically, as shown in FIG. 4B, the common circuit board 22 is formed by a circuit board body 22a formed of a conductive material such as aluminum, an insulating layer 22b adhered on the entire upper surface of the circuit board body 22a, conductive layers 22c formed on the insulating layer 22b to have a predetermined circuit pattern and to define a circuit network, and circuit elements 22d fixed on and electrically connected to the conductive layers 22c.

A vertically extending opening portion 22e is performed at the central portion of the common circuit board 22, as shown in FIG. 4A. The circuit networks on the left and right portions of the opening portion 22e are connected to each other through a flexible circuit board 22f arranged over the opening portion 22e. By cutting off upper and lower edges (regions indicated by reference symbols X and Y) including the upper and lower ends of the opening portion 22e, the pair of circuit boards 16a and 16b are formed.

In the common circuit board 22, a plurality of connecting terminals 22g and 22h are formed in lines along edges on the upper surfaces of portions corresponding to outer edge portions of the circuit boards 16a and 16b, i.e., on the opposing inner surfaces of the edge portions defining one end of the case in a state wherein the opposing circuit boards 16a and 16b are vertically separated from each other to face each other. Connecting pins 24a and 24b of the male connector 12 (to be described later) are fixed and electrically connected to these connecting terminals 22g and 22h to project outwardly.

The side plate 18 described above is formed to have a U-shaped shape having one open side when viewed from the above. The open side portion serves as one end of the case. Stepped portions 18a and 18b for receiving three edge portions of each of the circuit boards 16a and 16b are formed at inner side edges of the upper and lower end faces of the side plate 18.

As shown in FIGS. 3A and 3B, the circuit boards 16a and 16b are fitted in the corresponding stepped portions 18a and 18b through seal rubber members 26. Since the seal rubber members 26 are inserted, dust or the like can be prevented from entering the case from gaps between the circuit boards and the stepped portions.

The frame 20 is formed to surround the side surfaces closed by the side plate 18 while vertically clamping it, as shown in FIG. 2. More specifically, the frame 20 consists of an integral body of a main body 20a opposing the side plate 18, and flange portions 20b and 20c extending inwardly from the upper and lower ends of the main body 20 by a predetermined distance (more specifically, by a distance large enough to clamp three non-open edge portions of the circuit boards 16a and 16b).

As shown in FIG. 3B, the frame 20 vertically clamps the upper and lower second and first circuit boards 16b and 16a respectively fitted in the upper and lower stepped portions 18b and 18a of the side plate 18, thereby integrally constituting the case. As shown in FIG. 3B, the flexible circuit board 22f for connecting circuit elements 22d of the upper and lower second and first circuit boards 16b and 16a is located slightly inwardly from the other end portion of the side plate 18.

Since the frame 20 is formed in this manner, the first and second circuit boards 16a and 16b can maintain an assembled state while being vertically separated at a predetermined distance in a state wherein the side plate 18 is interposed therebetween.

In this embodiment, the integrated circuit 10 is formed into a case-like shape, and the upper and lower surfaces of the case are directly defined by the circuit boards 16b and 16a. As a result, a compact, light-weight structure can be realized as compared to a case wherein the first and second circuit boards 16a and 16b are housed in a separate case.

The arrangement of the connecting device, having the connector structure as the characteristic feature of the present invention, for connecting the case-like integrated circuit 10 with the above arrangement to portions to be controlled of the vehicle will be described below with reference to FIGS. 5 to 8.

Figure 5:
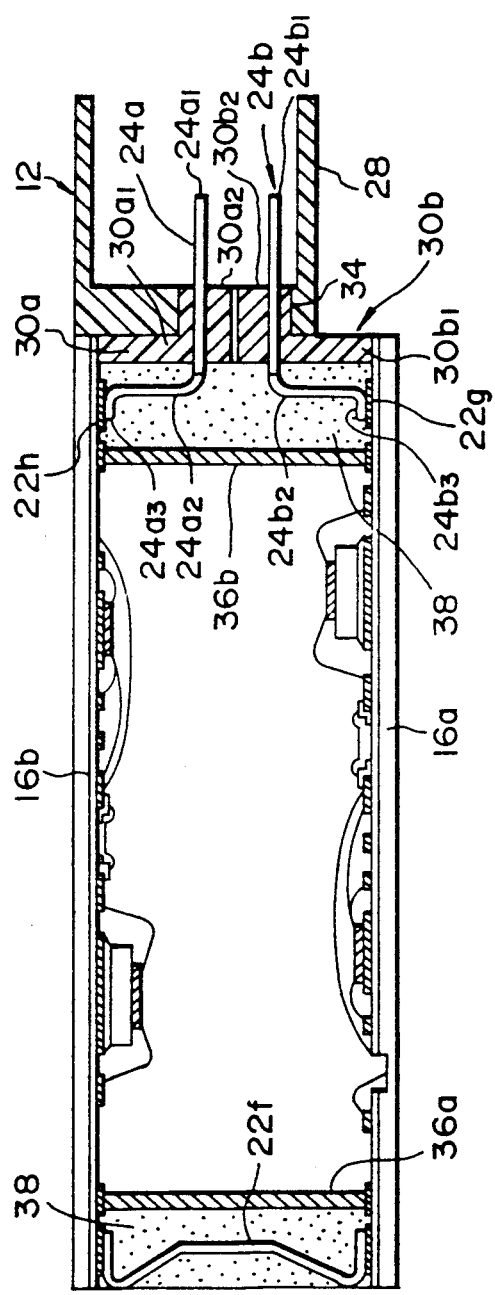
FIG. 5 is a sectional view showing an arrangement of a male connector mounted on the integrated circuit.

As generally shown in FIG. 1, connecting device comprises the male connector 12 mounted on one opening portion of the case-like integrated circuit 10 in a so-called internal mounting state, and the female connector 14 detachably connected to the male connector 12. As shown in FIG. 5, the male connector 12 has a so-called 3-piece structure, i.e., it comprises a connector housing 28 formed into a box-like housing having an open front surface, an upper connecting pin support member 30a on which the upper connecting pins 24a are disposed to be laterally aligned in line, and a lower connecting pin support member 30b on which the lower connecting pins 24b are disposed to be laterally aligned in line.

The upper and lower connecting pin support members 30a and 30b are formed vertically symmetrically about the vertically central portion. The upper connecting pin support member 30a is integrally formed into a substantially L shape by an upright segment $30a_1$, and a projection $30a_2$ projecting outwardly from the lower end of the upright segment $30a_1$. The lower connecting pin support member 30b is integrally formed into a substantially inverted-L shape by an upright segment $30b_1$, and a projection $30b_2$ projecting outwardly from the upper end of the upright segment $30b_1$.

Each upper connecting pin 24a is integrally formed by a horizontal portion $24a_1$ which horizontally extends through the projection $30a_2$ to project in the back-and-forth direction, a vertical portion $24a_2$ which extends vertically upward from the inner edge of the horizontal portion $24a_1$ along the inner surface of the upright segment $30a_1$, and a bent portion $24a_3$ which is inwardly bent from the upper end of the vertical portion $24a_2$. The bent portion $24a_3$ is defined as a connecting portion connected to the corresponding connecting terminal 22h formed on the upper second circuit board 16b by soldering. The outward projecting portion of the horizontal portion $24a_1$ is defined as a connecting portion inserted in and connected to the female connector 14.

Each lower connecting pin 24b is integrally formed by a horizontal portion $24b_1$ which horizontally extends through the projection $30b_2$ to project in the back-and-forth direction, a vertical portion $24b_2$ which extends vertically downward from the inner edge of the horizontal portion $24b_1$ along the inner surface of the upright segment $30b_1$, and a bent portion $24b_3$ which is inwardly bent from the lower end of the vertical portion $24b_2$. The bent portion $24b_3$ is defined as a connecting portion connected to the corresponding connecting terminal 22g formed on the lower first circuit board 16a by soldering. The outward projecting portion of the horizontal portion $24b_1$ is defined as a connecting portion inserted in and connected to the female connector 14.

The connecting pin support members 30a and 30b have sizes large enough to be just fitted in the one-end opening portion of the case-like integrated circuit 10 in a state wherein they are coupled vertically. In other words, a range of the two upright segments $30a_1$ and $30b_1$ (i.e., an outer periphery) of the vertically coupled support members 30a and 30b just defines the inner periphery of the one-end portion of the integrated circuit 10.

Recesses 32a and 32b are respectively formed at the central portions of the upper and lower edges of the connecting pin support members 30a and 30b. These recesses 32a and 32b define an injection hole of an epoxy resin which is injected after the male connector 12 is integrally assembled with the integrated circuit 10, as will be described later.

The upper and lower connecting pins 24a and 24b have vertically symmetrical shapes, i.e., the same shape, and the upper and lower connecting pin support members 30a and 30b also have vertically symmetrical shapes, i.e., the same shape. In this manner, since the connecting pin support members 30a and 30b on which the connecting pins 24a and 24b are mounted have the same shape, components can be commonly used, thus reducing cost.

Figure 7:
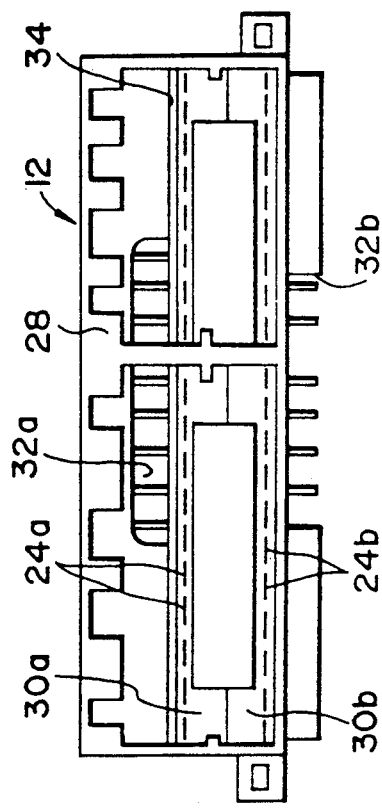
FIG. 7 is a front view showing an assembled state of the male connector.
Figure 6:
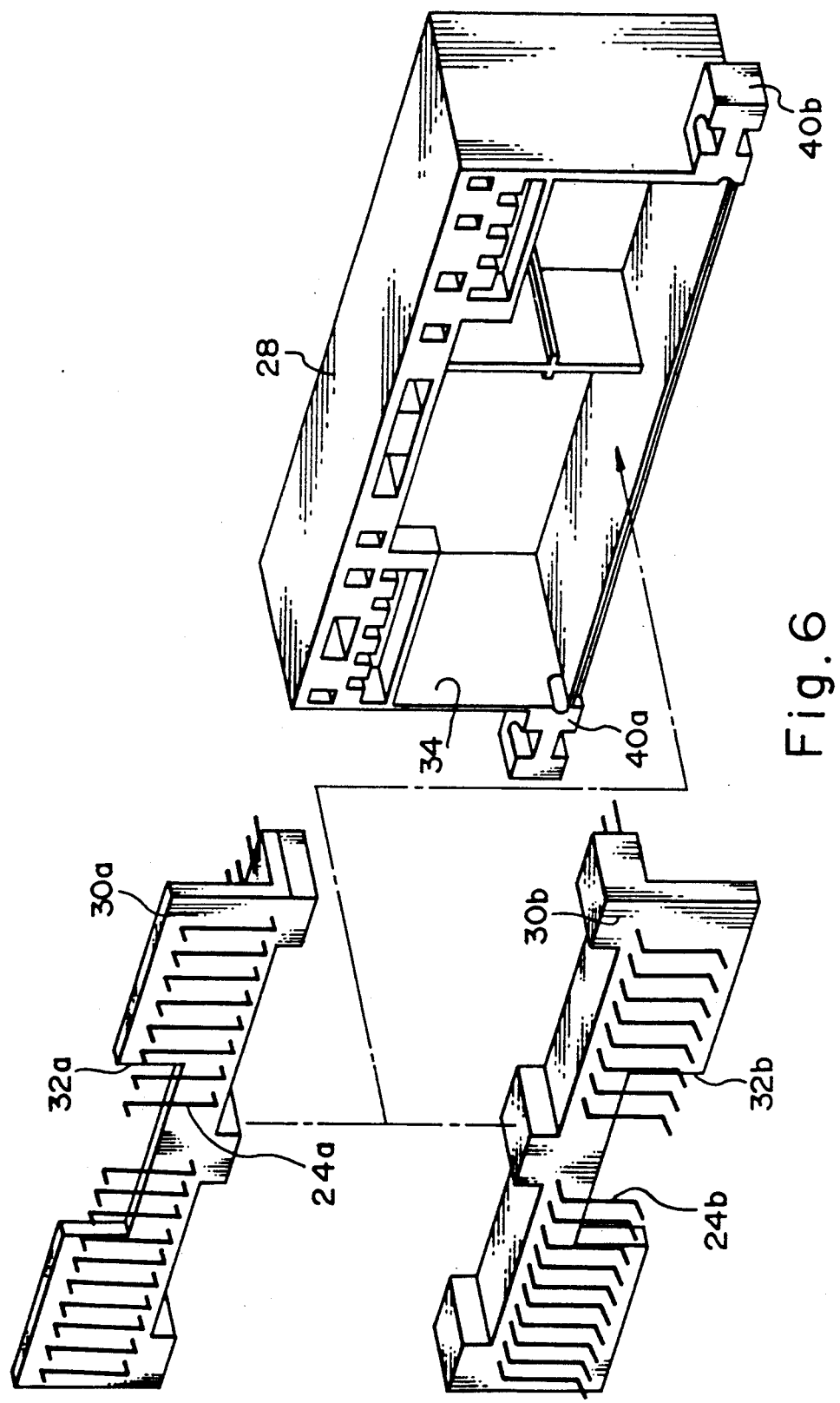
FIG. 6 is an exploded perspective view showing in detail the arrangement of the male connector.

The connector housing 28 described above has a fitting hole 34 which extends in the back-and-forth direction. The fitting hole 34 has a size large enough to receive the stacked projections $30a_2$ and $30b_2$ while the upper and lower connecting pin support members 30a and 30b are coupled, as shown in FIG. 7.

Mounting flanges 40a and 40b are formed integrally on two side portions of the connector housing 28. These flange portions 40a and 40b are fixed to a vehicle body (not shown) after the male connector 12 is mounted on and fixed to the integrated circuit 10. In this manner, a flange portion for mounting the integrated circuit 10 need not be provided to the integrated circuit 10 itself, resulting in the simple integrated circuit 10.

In this embodiment, and as shown in FIG. 1, a vertical interval l and a horizontal pitch p of the connecting pins 24a and 24b are defined on the basis of the conventional pin alignment specifications. As a result, the female connector 14 connected to the male connector 12 can employ a conventional one, thus providing economic advantages.

A conventional male connector is not employed since it is heavy and large in size. Instead, the special male connector 12 is formed in correspondence with the compact, light-weight case-like integrated circuit 10. Therefore, according to this embodiment, the compact, light-weight structure of the integrated circuit 10 can be assured.

An assembly operation of the male connector 12 whose assembled state is shown in FIG. 5, and an assembly operation of the integrated circuit 10 will be described below with reference to FIG. 8.

As has been described above with reference to FIGS. 4A and 4B, the upper and lower edges X and Y are cut from the common circuit board 22 on which the predetermined circuit elements 22d are mounted, so that the circuit boards 16a and 16b are formed in an open state on the same plane. As shown in FIG. 8, the corresponding pin support members 30a and 30b are fixed to the circuit boards 16a and 16b in the open state by an adhesive.

As described above, the corresponding connecting pins 24a and 24b have already been mounted on these connecting pins support members 30a and 30b. In this manner, these connecting pins 24a and 24b are soldered to the corresponding connecting terminals 22g and 22g of the circuit boards 16a and 16b in the open state. In particular, a precise soldering operation is required since the number of connecting terminals 22g and 22h is large. In this embodiment, however, since the circuit boards 16a and 16b are set in the open state on the same plane, the soldering operation can be reliably executed, thus improving workability and assuring easy assembly.

Thereafter, the other circuit board 16b is lifted while one circuit board 16a is held in position, and is moved to a position above and parallel to the lower one circuit board 16a. As shown in FIG. 8, the connecting pin support members 30a and 30b are then coupled vertically. When the connecting pin support members 30a and 30b are vertically coupled in this manner, the circuit boards 16a and 16b are held to be parallel to each other.

Prior to the coupling operation, frame members 36a and 36b for keeping a predetermined interval between the circuit boards 16a and 16b, and shielding an internal space from the outside while reinforcing the mechanical strength of the integrated circuit 10 are mounted in an upright state on the front and rear portions of the lower first circuit board 16a, as shown in FIG. 5. One frame member 36a is located slightly inwardly from the flexible circuit board 22f. The other frame member 36b is located slightly inwardly from the connecting terminals 22g and 22h.

The assembly is fitted in the fitting hole 34 of the connector housing 28 while maintaining the coupled state of the members 30a and 30b. In the fitting state, the male connector 12 is integrally mounted on the integrated circuit 10. Thereafter, as described above, the side plate 18 is attached to the integrated circuit 10, and the frame 20 is fitted thereon, thereby forming the integrated circuit 10 shown in FIG. 10, which integrally comprises the male connector 12.

After the assembly, an epoxy resin 38 is injected to a portion between the male connector 12 and the frame member 36b through the hole defined by the recesses 32a and 32b so as to securely adhere the assembled male connector 12 to the integrated circuit 10 and to satisfactorily fix the soldering portions between the connecting pins 24a and 24b and the corresponding connecting terminals 22g and 22h while perfectly shielding the interior of the integrated circuit 10. Thus, the portion between the male connector 12 and the frame member 36b is filled with the epoxy resin 38.

A portion in front of the frame member 36a is filled with the epoxy resin 38 to protect the flexible circuit board 22f and to shield the interior of the integrated circuit 10.

As described above, in the connector structure of this embodiment, the male connector 12 is constituted by the connector housing 28 and the vertically split connecting pin support members 30a and 30b. Thus, prior to assembly of the integrated circuit 10, the connecting pin support members 30a and 30b are respectively fixed to the corresponding circuit boards 16a and 16b, and the connecting pins 24a and 24b are connected to the corresponding connecting terminals 22g and 22h. In this manner, easy assembly of the integrated circuit 10 can be assured.

In the above embodiment, the upper and lower surfaces of the integrated circuit 10 to which the male connector 12 is fixed are defined by the pair of circuit boards 16b and 16a. As a result, according to this embodiment, the number of components of the integrated circuit 10 can be reduced, resulting in a compact, low-cost structure.

In this embodiment, each of the circuit boards 16a and 16b comprises the conductive circuit board body 22a formed of aluminum, the insulating layer 22b adhered on the circuit body 22a, and the conductive layers 22c adhered on the insulating layer 22b in a predetermined circuit pattern. As a result, heat radiated from the various circuit elements 22d can be dissipated by utilizing the aluminum circuit board body 22a as a heat dissipation plate. Therefore, another heat dissipation member need not be arranged, thus greatly reducing the size of the structure.

In this embodiment, since the upper and lower surfaces of the case are respectively defined by the pair of circuit boards 16b and 16a each having the aluminum circuit board body 22a, these circuit boards 16a and 16b can be utilized as electromagnetic shield members. As a result, the internal space of the integrated circuit 10 on this case is substantially electromagnetically shielded, and the circuit elements 22d do not easily suffer from adverse influences of electromagnetic waves.

The present invention is not limited to the arrangement of the embodiment described above, and various changes and modifications may be made within the spirit and scope of the invention.

In the above embodiment, the integrated circuit 10 having the function of the engine control unit has been exemplified. However, the present invention is not limited to this. For example, the integrated circuit 10 may serve as a functional component, e.g., an automatic vehicle velocity controller, a four-wheel steering controller, an automatic transmission controller or the like.

In the above embodiment, the male connector 12 is fixed to the integrated circuit 10 in a so-called internal mounting state. However, the present invention is not limited to this arrangement. For example, the male connector 12 may be externally fixed to the integrated circuit 10.

In the above embodiment, arrays of the connecting terminals 22g and 22h are formed on the circuit boards 16a and 16b in correspondence with the upper and lower arrays of connecting pins 24a and 24b. However, the present invention is not limited to this arrangement. For example, if a large number of connecting pins 24a and 24b are arranged, the connecting terminals 22g and 22h may be aligned each in two lines.

As described above, according to the present invention, a connector structure for a hybrid integrated circuit, in which two hybrid integrated circuit boards on each of which a conductive layer having a predetermined pattern is formed and a plurality of circuit elements are attached onto the conductive layer are separated from each other so that the conductive layers of the circuit boards oppose each other, comprises a pair of connecting pin support members which are fixed to the two hybrid integrated circuit boards, and on which a plurality of connecting pins connected to the conductive layers are attached; and a connector housing having a fitting hole in which the connecting pin support members are fitted while overlapping each other.

In the connector structure for the hybrid integrated circuit according to the present invention, the conductive layers are connected to each other through a connecting substrate.

In the connector structure for the hybrid integrated circuit according to the present invention, the connecting pin support members are fixed to terminal end sides of the hybrid integrated circuit boards, and projections formed when the connecting pin support members are integrated are fitted in the fitting hole of the connector housing.

In the connector structure for the hybrid integrated circuit according to the present invention, the hybrid integrated circuit boards are separated by a predetermined distance by case members.

In the connector structure for the hybrid integrated circuit according to the present invention, each hybrid circuit board comprises a metal substrate subjected to an insulating treatment.

In the connector structure for the hybrid integrated circuit according to the present invention, the connector housing is integrated with the hybrid integrated circuit by a molding agent injected into the hybrid integrated circuit.

In the connector structure for the hybrid integrated circuit according to the present invention, the pair of connecting pin support members define an injection hole for injecting the molding agent when the pair of connecting pin support members are integrated to each other.

Therefore, according to the present invention, there can be provided a connector structure for a hybrid integrated circuit, which can achieve a compact, low-cost structure, allows easy assembly, and can be reliably fixed to an integrated circuit.

As many apparently widely different embodiments of the present invention can be made without departing from the spirit and scope thereof, it is to be understood that the invention is not limited to the specific embodiments thereof except as defined in the appended claims.

What is claimed is:

1. A connector structure for a hybrid integrated circuit, which circuit includes two hybrid integrated circuit boards in each of which a conductive layer having a predetermined pattern is adhered on an insulating layer over a metal substrate, and a plurality of circuit elements are attached onto said conductive layer, said circuit boards being separated from each other so that said conductive layers of said circuit boards oppose each other and said metal substrates thereof directly face to the outside, and both circuit boards being electrically connected to each other through a flexible connecting substrate and being set to extend substantially parallel to each other, the connector structure comprising:
   (a) a pair of connecting pin support members which are fixed to said two hybrid integrated circuit boards, respectively, and capable of being joined with each other in a direction perpendicular to the extending direction of said circuit boards, each of said connecting pin support members having a plurality of connecting pins connected to said respective conductive layer of said circuit boards; and
   (b) a connector housing having a fitting hole through which said connecting pin support members while joined with each other are fitted in a direction parallel to said extending direction of said circuit boards.

2. The connector structure according to claim 1, wherein said connecting pin support members are fixed to terminal ends of said hybrid integrated circuit boards, respectively, and
   each of said connecting pin support members includes an upright segment fixed to the corresponding circuit board and a projection which is integrally formed on said upright segment, both of said projections being stacked on each other when said connecting pin support members are joined and fitted in said fitting hole of said connector housing.

3. The connector structure according to claim 1, further comprising a side plate for separating said hybrid integrated circuit boards by a predetermined distance, and wherein said pair of circuit boards form a space therebetween and said side plate and said pair of connecting pin support members are held in a closed position after assembly.

4. The connector structure according to claim 1, wherein each of said hybrid circuit boards comprises a metal substrate subjected to an insulating treatment.

5. The connector structure according to claim 1, further comprising a molding agent injected into said hybrid integrated circuit for integrating said connector housing with said hybrid integrated circuit.

6. A connector structure according to claim 5, wherein said pair of connecting pin support members define an injection hole for injecting said molding agent when said pair of connecting pin support members are joined with each other.

7. The connector structure according to claim 6, wherein said connecting pin support members are fixed to terminal ends of said hybrid integrated circuit boards, respectively, and
   each of said connecting pin support members includes a projection which is integrally formed, both of said projections being stacked on each other when said connecting pin support members are joined and fitted in said fitting hole of said connector housing.

8. The connector structure according to claim 6, further comprising a side plate for separating said hybrid integrated circuit boards by a predetermined distance, and
   wherein said pair of circuit boards form a space therebetween and said side plate and said pair of connecting pin support members are held in a closed position after assembly.

9. The connector structure according to claim 6, wherein each of said hybrid circuit boards comprises a metal substrate subjected to an insulating treatment.

10. The connector structure according to claim 2, wherein said projection is formed on the distal end of said upright segment and projects outwardly therefrom, and has a surface to be stacked on a surface of the opposite projection, said surface being parallel to the extending direction of said corresponding circuit board.

11. The connector structure according to claim 10, further comprising adhesion means for fixing said upright segment to the corresponding circuit board prior to assembling said circuit boards to be parallel to each other.

12. A method of assembling a connector structure for a hybrid integrated circuit, which circuit includes two hybrid integrated circuit boards in each of which a conductive layer having a predetermined pattern is adhered on an insulating layer over a metal substrate, and a plurality of circuit elements are attached onto the conductive layer, the method comprising the steps of:
   (a) setting the circuit boards in an open state on the same plane, both of the conductive layers facing to the upside, and both of the circuit boards being electrically connected to each other through a flexible connecting substrate;
   (b) fixing a connecting pin supporting member to each of the circuit boards which are set in the open state on the same plane, the connecting pin supporting member being provided with a plurality of connecting pins;

(c) affixing the connecting pins to the corresponding connecting terminals of the circuit boards;

(d) moving one circuit board to a position above the other circuit board so that the conductive layers of the circuit boards oppose each other;

(e) joining the connecting pin supporting members with each other in a direction perpendicular to the extending direction of the circuit boards; and (f) fitting the connecting pin supporting members in a hole of a connector housing while maintaining the joined state of the connecting pin supporting members.

13. The method according to claim 12, wherein said fitting step (f) is performed so that the connector housing is moved in the extending direction of the circuit boards and the connecting pin supporting members are inserted through the hole of the connector housing.

14. The method according to claim 12, further comprising the step of:

attaching frame members on one of the circuit boards to keep a predetermined interval between the circuit boards, prior to moving step (d).

15. The method according to claim 14, further comprising the step of:

injecting an epoxy resin to a portion behind the connector housing after fitting step (f).

16. The method according to claim 12, further comprising the step of:

attaching a side plate between the circuit boards after fitting step (f).

* * * * *